(12) United States Patent
Wang et al.

(10) Patent No.: US 11,237,672 B2
(45) Date of Patent: Feb. 1, 2022

(54) APPARATUS INTEGRATED WITH DISPLAY PANEL FOR TOF 3D SPATIAL POSITIONING

(71) Applicant: BOE Technology Group Co., Ltd., Beijing (CN)

(72) Inventors: Pengpeng Wang, Beijing (CN); Haisheng Wang, Beijing (CN); Xiaoliang Ding, Beijing (CN); Yangbing Li, Beijing (CN); Likai Deng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 74 days.

(21) Appl. No.: 16/631,445

(22) PCT Filed: Feb. 1, 2019

(86) PCT No.: PCT/CN2019/074383
§ 371 (c)(1),
(2) Date: Jan. 15, 2020

(87) PCT Pub. No.: WO2020/155092
PCT Pub. Date: Aug. 6, 2020

(65) Prior Publication Data
US 2021/0216163 A1  Jul. 15, 2021

(51) Int. Cl.
*G06F 3/042* (2006.01)
*G06T 7/50* (2017.01)
(Continued)

(52) U.S. Cl.
CPC .......... *G06F 3/0421* (2013.01); *G01S 7/4813* (2013.01); *G01S 17/42* (2013.01);
(Continued)

(58) Field of Classification Search
CPC ........ G06F 3/0421; G06F 2203/04108; G06K 9/0004
See application file for complete search history.

(56) References Cited

U.S. PATENT DOCUMENTS

| 5,726,443 | A | * | 3/1998 | Immega | ............... | H03K 17/941 |
| | | | | | | 250/227.2 |
| 8,335,353 | B2 | * | 12/2012 | Yamamoto | ......... | G06K 9/00046 |
| | | | | | | 382/115 |

(Continued)

FOREIGN PATENT DOCUMENTS

| CN | 107180853 A | 9/2017 |
| CN | 107422511 A | 12/2017 |

(Continued)

OTHER PUBLICATIONS

International Search Report & Written Opinion dated Nov. 1, 2019, regarding PCT/CN2019/074383.

*Primary Examiner* — Kevin M Nguyen
(74) *Attorney, Agent, or Firm* — Intellectual Valley Law, P.C.

(57) ABSTRACT

A display apparatus for detecting three-dimensional (3D) spatial information. The display apparatus includes a display panel having a plurality of active subpixels in a display area configured with multiple gaps respectively between at least some active subpixels, the display panel including a counter substrate at front and a backplane substrate at back; an optical layer at a back side of the backplane substrate; multiple light sensors attached discretely on a back side of the optical layer and substantially aligned with the multiple gaps in the display area; and a light source on the backplane substrate and configured to provide an infrared light signal in a direction toward a field of view beyond the counter substrate. The multiple light sensors are configured to detect respective infrared light signals reflected from multiple (Continued)

different regions of an object in the field of view for collectively deducing 3D spatial information of the object.

19 Claims, 6 Drawing Sheets

(51) Int. Cl.
*G01S 17/894* (2020.01)
*G02F 1/29* (2006.01)
*G01S 7/481* (2006.01)
*G01S 17/42* (2006.01)
*H01L 25/16* (2006.01)
*H01L 25/18* (2006.01)
*H01L 27/32* (2006.01)

(52) U.S. Cl.
CPC ............ *G01S 17/894* (2020.01); *G02F 1/294* (2021.01); *G06T 7/50* (2017.01); *H01L 25/167* (2013.01); *H01L 25/18* (2013.01); *G06F 2203/04108* (2013.01); *G06T 2207/10048* (2013.01); *H01L 27/3232* (2013.01)

(56) References Cited

U.S. PATENT DOCUMENTS

| | | | |
|---|---|---|---|
| 10,181,201 | B2* | 1/2019 | Wan ...................... G01S 7/4918 |
| 10,290,257 | B1* | 5/2019 | Slobodin ............ H01L 27/14605 |
| 2014/0035959 | A1* | 2/2014 | Lapstun ..................... G02F 1/33 |
| | | | 345/690 |
| 2016/0069999 | A1 | 3/2016 | Lee et al. |
| 2016/0330374 | A1* | 11/2016 | Ilic ..................... H04N 5/23222 |
| 2019/0033453 | A1* | 1/2019 | Crouch ................ H04B 10/505 |
| 2019/0086659 | A1 | 3/2019 | Ding et al. |
| 2019/0095674 | A1* | 3/2019 | Ko ............................. G02B 6/08 |
| 2019/0146283 | A1 | 5/2019 | Qin et al. |
| 2019/0303639 | A1* | 10/2019 | He ....................... G06K 9/0012 |
| 2020/0034597 | A1* | 1/2020 | He ................... G02F 1/133308 |
| 2020/0201098 | A1 | 6/2020 | Gu et al. |

FOREIGN PATENT DOCUMENTS

| | | |
|---|---|---|
| CN | 107422571 A | 12/2017 |
| CN | 107505753 A | 12/2017 |
| CN | 109146945 A | 1/2019 |
| CN | 109271057 A | 1/2019 |

* cited by examiner

APPARATUS INTEGRATED WITH DISPLAY PANEL FOR TOF 3D SPATIAL POSITIONING

CROSS-REFERENCE TO RELATED APPLICATION

This application is a national stage application under 35 U.S.C. § 371 of International Application No. PCT/CN2019/074383, filed Feb. 1, 2019, the contents of which are incorporated by reference in the entirety.

TECHNICAL FIELD

The present invention relates to display technology, more particularly, to 3D display, scene depth detection, and time-of-fly (TOF) spatial positioning and gesture recognition.

BACKGROUND

The popularity of mobile devices such as mobile phones has made modern society enter the era of universal screen reading. Many sensors are integrated with display screen devices. With the development of three-dimensional (3D) display, machine vision, and remote sensing technologies, more and more technical applications require the acquisition of depth information for the scene, object recognition, and 3D spatial positioning in association with a flat panel display.

SUMMARY

In one aspect, the present invention provides a display apparatus for detecting three-dimensional (3D) spatial information, comprising a display panel comprising a plurality of active subpixels in a display area configured with multiple gaps between at least some active subpixels, respectively, the display panel comprising a counter substrate at front and a backplane substrate at back; multiple light sensors substantially aligned with the multiple gaps in the display area, respectively; a light source on the backplane substrate and configured to provide an infrared light signal in a direction toward a field of view beyond the counter substrate; and an optical layer configured to focus infrared light signals reflected from multiple different regions of an object in the field of view illuminated by infrared light signals to the multiple light sensors, the multiple light sensors being attached discretely on a back side of the optical layer and; wherein the multiple light sensors are configured to detect infrared light signals reflected from the multiple different regions of the object for collectively deducing 3D spatial information of the object.

Optionally, the multiple light sensors comprise multiple pre-fabricated integrated circuit chips attached to the back side of the optical layer, respectively.

Optionally, an individual light sensor of the multiple light sensors comprises one or more light-sensing pixels configured to convert light signals to electrical signals to deduce one or more pieces of time-of-fly (TOF) information based on one or more infrared light signals reflected from one or more regions of the object disposed within a range of the field of view.

Optionally, the individual light sensor comprises a single light-sensing pixel and is configured to detect infrared light signal reflected from a distinct region of the object within a first range of the field of view, the distinct region being non-overlapped with other regions corresponding to other light sensors having a single light-sensing pixel, the individual light sensor being configured to process the one piece of TOF information to generate an image of a single pixel associated with a depth information of the distinct region of the object.

Optionally, the individual light sensor comprises a plurality of light-sensing pixels and is configured to detect one infrared light signal reflected from a region of the object within a second range of the field of view, and also partially detect more infrared light signals reflected from some other regions that are partially overlapped with the region of the object, the individual light sensor having the plurality of light-sensing pixels being configured to generate an image of one or more of pixels associated with depth information of the region of the object.

Optionally, the multiple pre-fabricated integrated circuit chips are disposed to multiple substantially uniformly distributed discrete locations behind the display area of the display panel and electrically coupled to a controller for assembling all patches of images associated with depth information of regions to calculate a complete 3D spatial image of the object, respectively.

Optionally, the controller comprises a preset algorithm configured to remove shadowing portions in gray-scale data directly converted from the infrared light signals detected by the multiple light sensors before performing depth calculation to deduce the 3D spatial image of the object.

Optionally, the multiple gaps in the display area provide an optical path for the infrared light signal emitted from the light source to illuminate the object in the field of view and optical paths for allowing infrared light signals partially reflected from the object to reach the optical layer.

Optionally, the light source comprises an infrared light-emitting diode or a vertical-cavity surface-emitting laser diode, configured to emit an infrared light with a wavelength of 870 nm or 940 nm that is modulated with a single frequency square wave by a modulator.

Optionally, the apparatus comprises one or more light sources disposed either at a back side of the optical layer by surface-mount or transfer-print or at a front side of the backplane substrate in a peripheral region of the display area, wherein the backplane substrate is made slightly bigger than the counter substrate.

Optionally, the optical layer comprises a plurality of micro lenses at a back side of the backplane substrate, at least one or more micro lenses being positioned according to an individual light sensor of the multiple light sensors attached to the back side of the optical layer to couple the infrared light signal reflected from the object through respective one of the multiple gaps in the display area to the individual light sensor.

Optionally, the optical layer comprises a liquid crystal lens, the liquid crystal lens comprising a liquid crystal layer and a plurality of lens electrodes for driving the liquid crystal layer; wherein the plurality of lens electrodes in the liquid crystal layer are independently adjusted to allow multi-angled illumination of a target in the field of view via the infrared light signals and multi-angled reflection of the infrared light signals detected by the multiple light sensors for achieving 3D spatial positioning of the target.

Optionally, an individual light sensor of the multiple light sensors comprises a single pixel or a plurality of pixels for sensing the multi-angled reflection of the infrared light signals carrying one or more pieces of time-of-fly (TOF) information associated with a portion of the target, producing a patch of image in a single pixel or a plurality of pixels.

Optionally, the multiple light sensors further comprise integrated circuits coupled to each other and configured to assemble all patches of images for 3D spatial positioning of the target, respectively.

Optionally, the plurality of lens electrodes in the liquid crystal layer are independently disposed at different locations according to the multiple light sensors aligned with the multiple gaps in the display area and are adjusted at different time to turn nearby portions of the liquid crystal layer to effective lenses with different angles and focal lengths, respectively.

Optionally, some of the effective lenses are controlled to guide the infrared light signals emitted from at least one light source to illuminate the target disposed in a depth range of the field of view from multiple different angles.

Optionally, some of the effective lenses are controlled to guide the infrared light signals partially reflected from the target disposed in a depth range of the field of view to multiple angled directions to be detected by some of the multiple light sensors.

Optionally, the light source comprises an infrared light-emitting diode or a vertical-cavity surface-emitting laser diode, configured to emit an infrared light beam that is modulated with a single frequency square wave by a modulator.

Optionally, the light source is disposed via surface-mount or transfer-print to a back side of the backplane substrate at least partially aligned with some of the multiple gaps in the display area, wherein the backplane substrate is made to be slightly larger than the counter substrate.

Optionally, the light source is disposed via surface-mount or transfer-print to a front side of the backplane substrate in a peripheral region of the display area, wherein the backplane substrate is made to be slightly larger than the counter substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
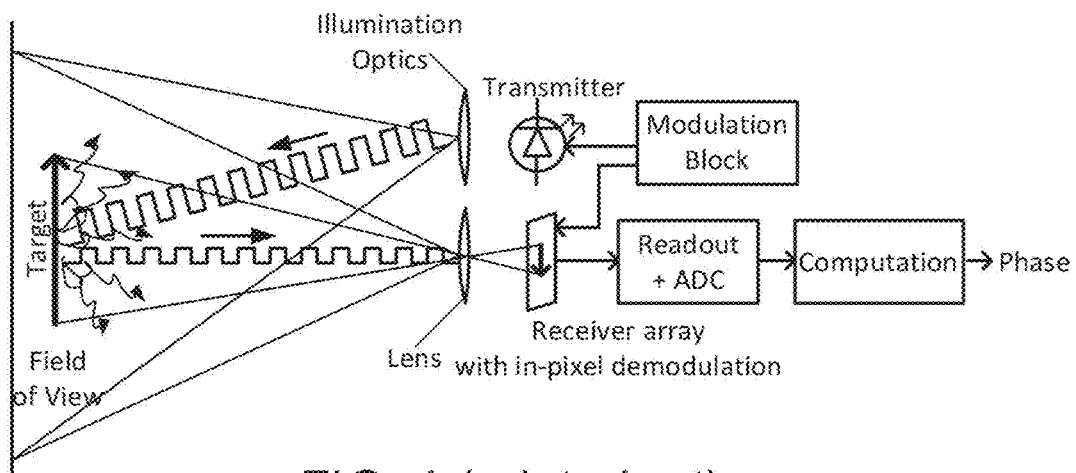
FIG. 1 is a schematic diagram of a conventional time-of-fly (TOF) depth camera module based on a large array of light sensors with in-pixel demodulation.

Traditionally, scene depth information can be captured by a 3D depth camera utilizing a silicon-based time-of-fly (TOF) light sensor containing a large array of light-sensing integrated circuits. FIG. 1 shows a schematic diagram of a conventional TOF depth camera operating for capturing 3D spatial information. In the example, the camera is operated as an independent module including a light source, a receiver array, and electronics. The light source emits an infrared light. It is modulated as a square wave signal by a modulation block and transmitted out via a transmitter. The light signal is projected by a illumination optics to a target at a distance away in the field of view and scattered by the surface of the target and at least partially reflected back from a particular region of the target. A lens is disposed in front of the receiver array to collect the reflected light signal. The receiver array includes the large array of silicon-based light-sensing pixels made by integrated circuits configured with in-pixel demodulation. The light signal sensed by the receiver array is converted to electrical signal passed to readout electronics and turned to digitized signal by an ADC circuit. Then, the digitized signal is used to calculate depth information of the particular region of the target based on time-of-fly information carried in the digitalized signal. Again, this process can be done continuously in time so that a dynamic scene depth information can be deduced.

However, the 3D depth camera is fairly large in physical size due to the usage of the receiver array with silicon-based large array of pixel circuits, which is in centimeter order of magnitude. Such 3D depth camera becomes too big to be disposed in the middle of display area when it is integrated with the display apparatus. Alternatively, if one tries to get around the above problem by disposing this 3D depth camera to backside of the display panel, the large size of the receiver array makes it impossible to design a display panel with an optical path to allow the receiver array for properly sensing light from an object disposed in front side of the display panel. Additionally, the large size silicon-based sensor array is too expensive for many applications requiring only low-resolution imaging.

Figure 2:
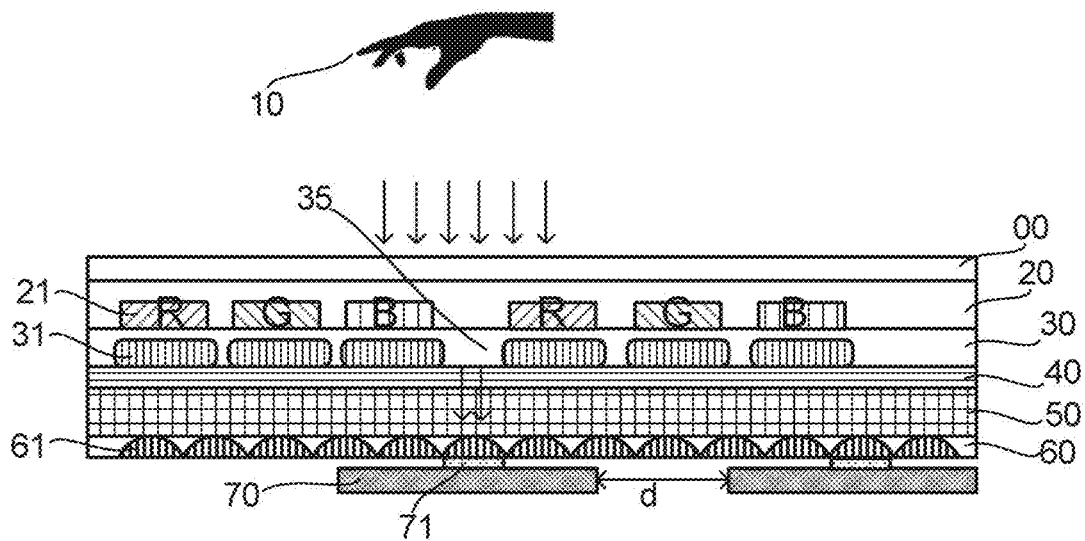
FIG. 2 is a schematic side view of an apparatus integrated with an OLED display panel for TOF gesture recognition according to some embodiments of the present disclosure.

Accordingly, the present disclosure provides, inter alia, an apparatus integrated with the display panel for detecting three-dimensional (3D) spatial information, for 3D scene depth positioning, and gesture recognition, that substantially obviate one or more of the problems due to limitations and disadvantages of the related art. In one aspect, the present disclosure provides an apparatus integrated with an OLED display panel for TOF gesture recognition. FIG. 2 is a schematic side view of an apparatus integrated with an OLED display panel for TOF gesture recognition according to some embodiments of the present disclosure. Referring to FIG. 2, the OLED display panel is disposed with a cover glass 00 facing up and an object 10 (or a hand gesture as shown in the example) is placed a distance above the cover glass 00. The present disclosure provides a highly integrated display apparatus for detecting the relevant 3D spatial information about the object in real time.

Referring to FIG. 2, the apparatus includes an organic light-emitting diode (OLED) display panel including a plurality of active subpixels 31, such as Red, Green, and Blue subpixels, in a display area made by an 1 organic active layer 30. Optionally, each organic active subpixel includes an organic light-emitting diode that is driven, together with all pixel circuits built in the organic active layer, to emit light. Above the organic active layer 30 it is a color-filter glass substrate 20 on which a plurality of red, green, and blue colored film patterns 21 are formed to enable color display in the display panel. In an embodiment, the display area that mainly made by the organic active layer 30 is configured with multiple gaps 35 between at least some active subpixels, respectively. The organic active layer 30 is formed on a backplane glass substrate 50 with some other components like thin-film transistors, capacitors, or signal lines buried in a layer depicted as layer 40. Overall, the OLED display panel is configured to engage the color-filter glass substrate 20 at front and a backplane glass substrate 50 at back.

Further, the apparatus includes an optical layer 60 attached to the backside of the backplane glass substrate 50. The optical layer 60 includes a plurality of micro lenses 61 be embedded. Optionally, the micro lenses are micro-nano optics embedded in the layer. In particular, the micro lenses are set at regions aligned with multiple gaps 35 pre-defined in the display area during the formation of the organic active layer 30 for arranging the plurality of red, green, and blue light-emitting subpixels and associated thin-film transistors. Furthermore, the multiple gaps 35 between the active subpixels can be arranged in such a way that they are separated from each other by a certain distance substantially uniform across entire display panel. For example, two neighboring gap site location may be several or several tens of pixels apart. Optionally, the multiple gaps 35 may be arranged regularly in certain pattern or fairly randomly distributed except not being closely next to each other. The gap 35 between the active subpixels is sufficiently wide to allow light to pass through with minimized deflection or scattering without being blocked.

In the embodiment, the apparatus additionally includes multiple light-sensing chips 70 attached to the back side of the optical layer 60. The light-sensing chip 70 is an integrated circuit (IC) chip having a light sensor 71 disposed near one or more micro lenses 61 in the optical layer 60. In a specific embodiment, the light-sensing chip 70 is prefabricated, which can be done through a simplified process with low cost, before being attached to the back side of the optical layer 60 using a surface mount process or transfer print process. The process can be well controlled such that the attachment location of the light sensor 71 is at a preselected location that is substantially aligned with a gap 35 between the active subpixels in the display area. The process can be performed for multiple light-sensing chips 70 to be attached to multiple prearranged discrete locations in the back side of the optical layer 60 at a same time, respectively. Optionally, on average (or uniformly) two neighboring light-sensing chips 70 are set to be a distance d apart. The integrated circuits associated with all the multiple light-sensing chips 70 are mutually coupled electrically and laid by the surface-mount or transfer print process.

Figure 5:
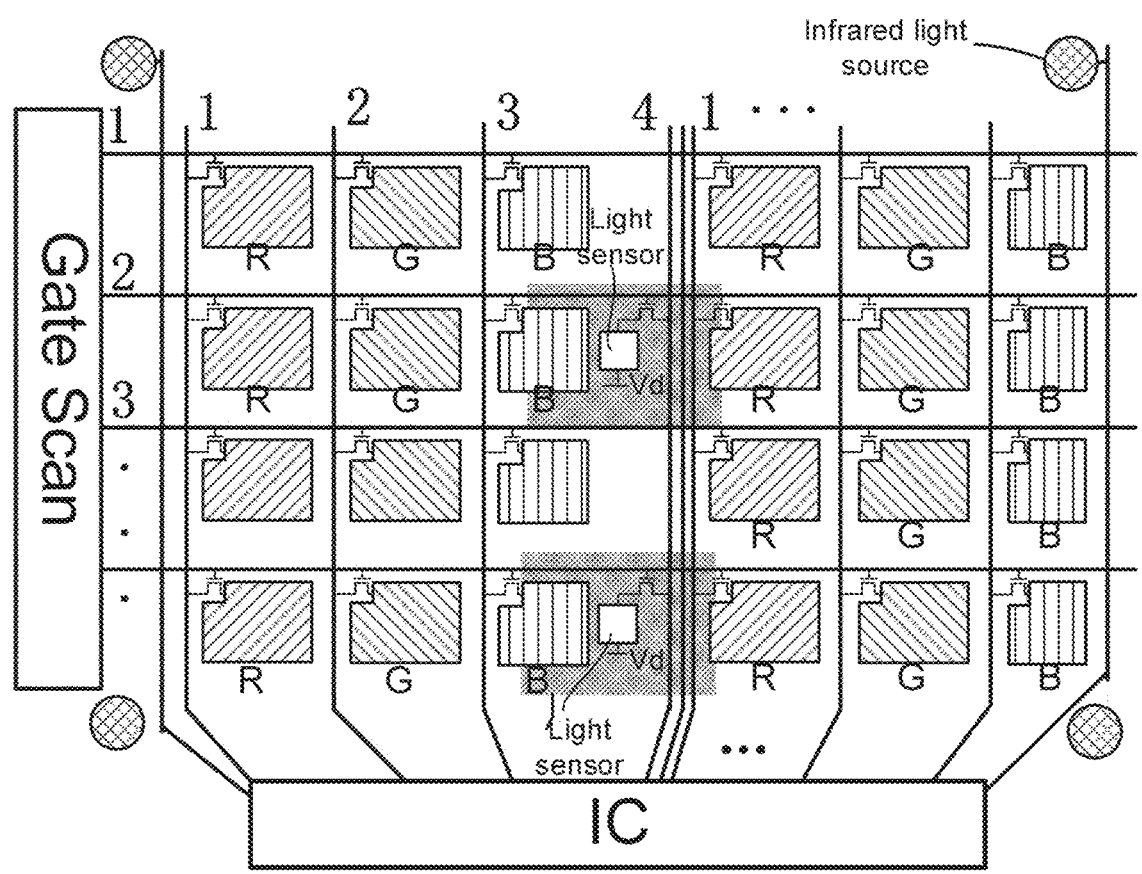
FIG. 5 is a schematic top view of an apparatus integrated light sensor with an OLED display panel for TOF gesture recognition according to some embodiments of the present disclosure.

FIG. 5 shows an example of a top view of two light-sensing chips disposed in the display area of a display panel according to an embodiment of the present disclosure. Referring to FIG. 5, a portion of display area is shown with six columns four rows of subpixels. Along each row of subpixels sequentially started three subpixels of a red subpixel R, a green subpixel G, a blue subpixel B, and a gap is allocated between the last blue subpixel B of the first three subpixels (or a first pixel) and a next red subpixel R of next three subpixels (or a next pixel). Along the column direction in the gap, two light-sensing chips are attached with one being located in the gap of row 2 and another being located in the gap of row 4, separated by a distance of at least one row of subpixels. In general, the light-sensing chips are disposed at the backside of the display panel so that only partial area is visible from the top view. Yet, each light-sensing chip is disposed such that a light sensor as marked in square pattern is substantially free from being blocked by any subpixels nearby. Therefore, the light sensor therein is fully accessible for sensing any light signal, including those reflected light carrying time-of-fly (TOF) information of a target (not shown) above the display panel, coming from front side (or top of this figure) of the display panel. Optionally, one or more infrared light source can be placed at boundary part of the display area. They are configured to emit an infrared light beam that is modulated (e.g., to a square wave signal). The light sensor is set to detect any reflected infrared light signal from the target disposed in a field of view (here is in a range above the display panel). The locations of the infrared light sources are chosen at the corners or boundaries of the display area, thereby allowing the emitted infrared light to illuminate the target substantially without blocking from other devices laid thereof. Alternatively, the infrared light sources can still be placed on the backside of the display panel, just like those light-sensing chips, provided that the locations are properly selected to also substantially align with some gaps between the active subpixels in the display area.

Referring to the FIG. 5, the light sensor is optionally an photodetector that is controlled by a transistor circuit to convert light signal into an analog current signal, which is then sent to an integrated circuit (IC) where a microcontroller including analog-to-digital converter, digital processor, and memory device, processes the digital signal converted from the analog current signal.

Optionally, the light sensor 71 associated with the light-sensing chip 70 is configured to include a small array up to a few tens of light-sensing pixels. This is significantly smaller than traditional silicon-based image sensor for 3D depth camera. Reducing number of pixels in each sensor can significantly reduce the size so that an individual light sensor can be easily fit in a gap that is free from any blocking of the incoming infrared light signal. In an embodiment, the light sensor 71 can be a single-pixel device. When an infrared light beam is reflected from target back to the display panel, the light beam can pass through the gap between the active subpixels of the display area to reach the optical layer. The micro lenses in the optical layer can confine and focus the light beam to the light sensor 71, provided it is at least partially aligned with the gap. For the light sensor made as a single-pixel device, it should be no problem for it to receive full strength of the reflected infrared light signal. With a small array up to a few tens of light-sensing pixels, for example, an 8×8 array, the light sensor 71 can be still made with relatively small size to align with the gap to receive major portion of the reflected light signal with relatively small power loss.

Figure 3:
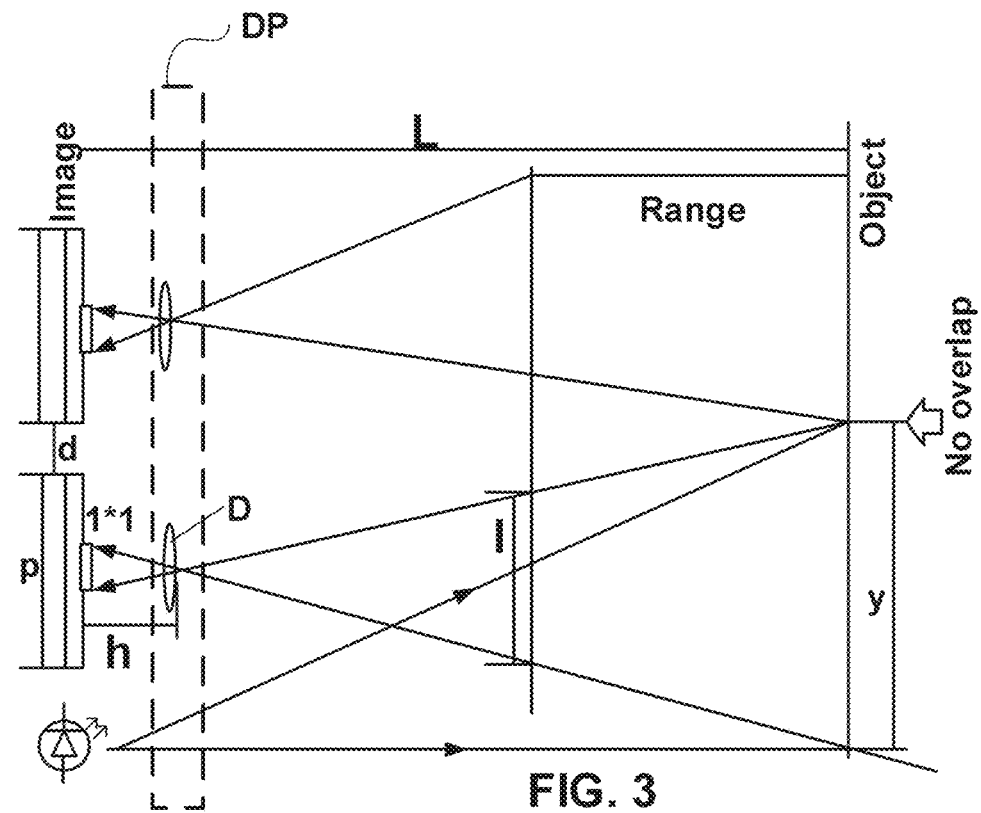
FIG. 3 is a schematic diagram showing a principle of spatial positioning according to an embodiment of the present disclosure.

FIG. 3 is a schematic diagram showing a principle of spatial positioning according to an embodiment of the present disclosure. As shown, each sensor is a single pixel device (1*1) disposed at an 'Image' plane on the back side of the optical layer with a distance h from a micro lens D. Each sensor is optionally coupled to a processing circuit with a physical size of p, which can be arranged to have an average separation of d from another processor circuit of a neighboring sensor. A light source emits a light beam to illuminate a region y of the object disposed at an 'Object' plane in the field of view. The 'Object' plane is at a distance of L away from the 'Image' plane and particularly is in a 'Range' beyond front side of the display panel. For the object disposed within the 'Range' in the field of view, the light beam reflected from the region y of the object can just be passed through the set gap I and reach the micro lens D which focuses it to the sensor. At least a portion of the region y of the object can be detected by the sensor via the reflected light, though the size of region y will be smaller as the object approaches closer to the display panel DP. If the object is disposed outside the Range, a first reflected light signal from the region (detected by a first sensor) may be mixed partially with a second reflected light signal from another region next to the region (detected by a second sensor apart from the first sensor). At the same time, as the object moves farther, the size of the region being illuminated becomes bigger. The region reflecting the first reflected light signal may be partially overlapped with another region next to the region reflecting the second reflected light signal. While for a single-pixel sensor, it is preferred to use reflected light signals associated with non-overlapped regions of object to generate (1*1) pixel image associated with a distinct region based on pure time-of-fly information, respectively. Thus, the Range shown in FIG. 3, defines a limited sensible range for the first (1*1) sensor. In general, the advantage of using the single-pixel sensor lies to have a sensible range that is closer to the display panel than sensor with larger array of pixels. Optionally, each light sensor with single pixel and associated integrated circuit are configured to generate a (1*1) pixel image characterizing depth of one region of the object. The integrated circuits associated with all light sensors disposed to the back side of the optical layer of the backplane glass substrate of the display panel are coupled together to assemble these (1*1) pixel images to a final multi-pixel image characterizing depth of substantially whole object. Optionally, more pixels in the final multi-pixel images requires disposing more single-pixel light sensors to the display panel.

Figure 4:
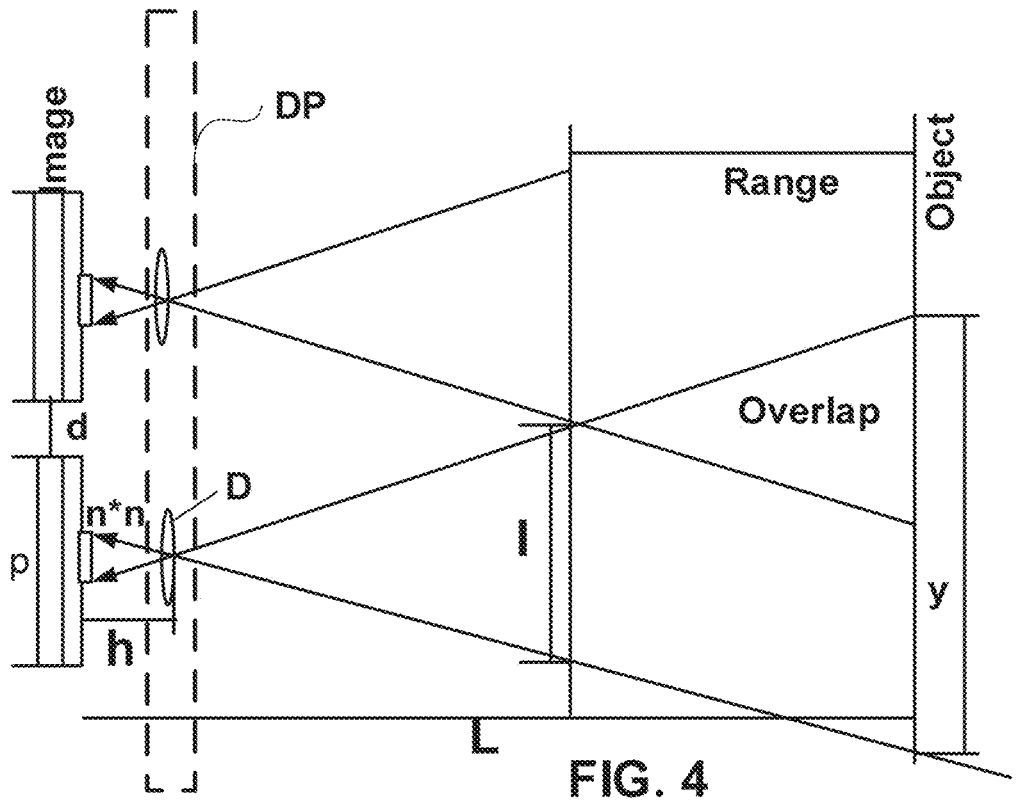
FIG. 4 is a schematic diagram showing a principle of spatial positioning according to another embodiment of the present disclosure.

FIG. 4 is a schematic diagram showing a principle of spatial positioning according to another embodiment of the present disclosure. Referring to FIG. 4, each sensor includes a small array of (n*n) light-sensing pixels, which is again disposed at an 'Image' plane on the back side of the optical layer with a distance h from a micro lens D. Each sensor is coupled to a processing circuit with a physical dimension of p, which can be arranged to have an average separation of d from another processing circuit of a neighboring sensor. For the object disposed at an 'Object' plane at a distance of L from the 'Image' plane and a distance 'Range' beyond the display panel, the light beam reflected from the region y of the object in the field of view can just be passed through the set gap I and reach the micro lens D which focuses the light to a first sensor with the small array of (n*n) light-sensing pixels. This light beam is totally sensed by the small array of (n*n) light-sensing pixels. Within the Range of the object being disposed in the field of view, part of the region y also reflects light beam back to another micro lens which focuses the light to a second sensor (also with (n*n) pixels) separated from the first sensor. As the size of the light sensor becomes larger, each light sensor can detect a larger region of the object from which reflects light beam (e.g., the region y in FIG. 4). In an embodiment, the region y shown in FIG. 4 for a light sensor with a small array of light-sensing pixels is larger than the region y shown in FIG. 3 for a light sensor with single light-sensing pixel. In this embodiment, each light sensor is configured to generate a (n*n) pixel image associated with the region y based on the TOF information carried by the reflected light beam from the region y although part of the region y may also contribute TOF information to another (n*n) pixel image generated by a neighboring light sensor. The integrated circuits associated with all light sensors disposed to the back side of the optical layer of the backplane glass substrate are coupled together to assemble these (n*n) patches of images to a complete image characterizing depth information of the object in the field of view.

Figure 6:
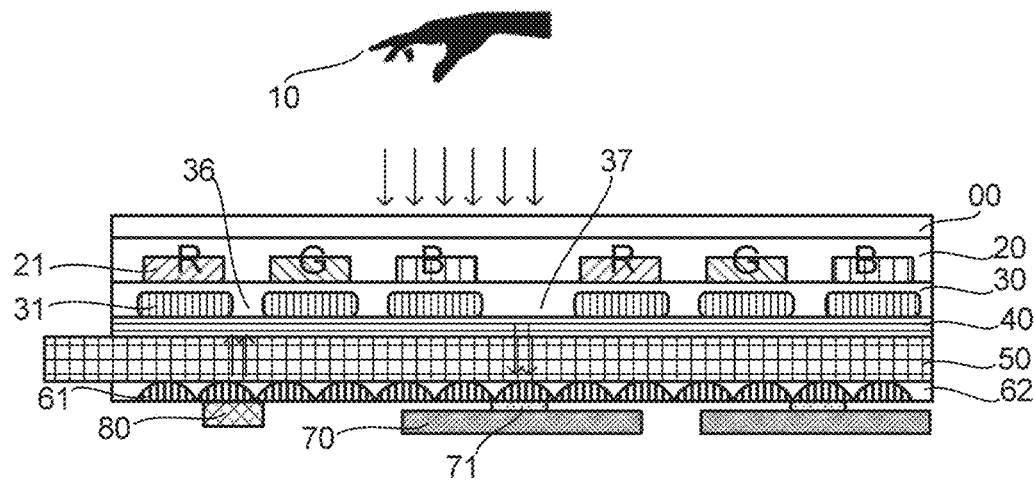
FIG. 6 is a schematic side view of the apparatus integrated a micro-lens layer and TOF light sensors in display areas of an AMOLED display panel for gesture recognition according to an embodiment of the present disclosure.

FIG. 6 is a schematic side view of the apparatus integrated a micro-lens layer and TOF light sensors in display areas of an AMOLED display panel for gesture recognition according to an embodiment of the present disclosure. Referring to FIG. 6, an active-matrix organic light-emitting diode (AMOLED) display panel is configured substantially the same as the display panel described in FIG. 2. A micro-lens layer 62 is substantially the same as the optical layer 60 attached to the back side of the backplane glass substrate 50. Multiple micro lenses 61 are disposed around some pre-selected locations substantially aligned with some gaps 37 configured in the organic active layer 30 where a plurality of subpixels 31 are arranged. Optionally, the gaps 37 are distributed with certain spacing between each other substantially uniformly across the display panel, though uniform distribution is not a must and does not require high precision. Optionally, these gaps 37 provide optical paths between the subpixels 31 in the display area of the whole display panel.

Multiple light sensors 71 are disposed under back side of the micro-lens layer 62 at locations substantially aligned with at least some of the gaps 37, respectively, allowing the light sensors to receive incoming light signals through the optical paths without major scattering or blocking. Optionally, the light signal detected by one of the multiple light sensors 71 is reflected infrared light signals carrying TOF information of certain region(s) of an object 10 disposed in a certain range of the field of view above (a cover glass 00 of) the AMOLED display panel. Each light sensor 71 comprises one or more light-sensing pixels and is associated with a light-sensing integrated circuit. Optionally, each light-sensing integrated circuit is a pre-fabricated light-sensing chip that is surface-mounted on to the back side of the micro-lens layer 62. All these light-sensing chips are discretely distributed based on a predetermined pattern (uniform or not) and electrically coupled to each other to collectively form a virtual 3D depth camera for detecting 3D spatial information of the object in the field of view.

The infrared light signal is firstly provided by a light source 80 to illuminate the object 10. Optionally, the light source 80 is an infrared light-emitting diode operating with an infrared wavelength in 870 nm~880 nm or 940 nm~950 nm. Optionally, the light source 80 is a vertical-cavity surface-emitting laser diode emitting a laser light with an infrared wavelength of about 940 nm. Optionally, the infrared light is modulated to a single frequency square wave. Optionally, the light source 80 is also attached to the back side of the micro-lens layer 62. Referring to FIG. 6, the light source 80 is disposed within a display area substantially aligned with a gap 36 between the organic active subpixels. This gap 36 is pre-arranged to allow the infrared light signal coming from the light source 80 can pass through the AMOLED display panel just once with substantial reduction of power loss to reach the object 10 in the field of view above the cover glass 00.

Figure 7:
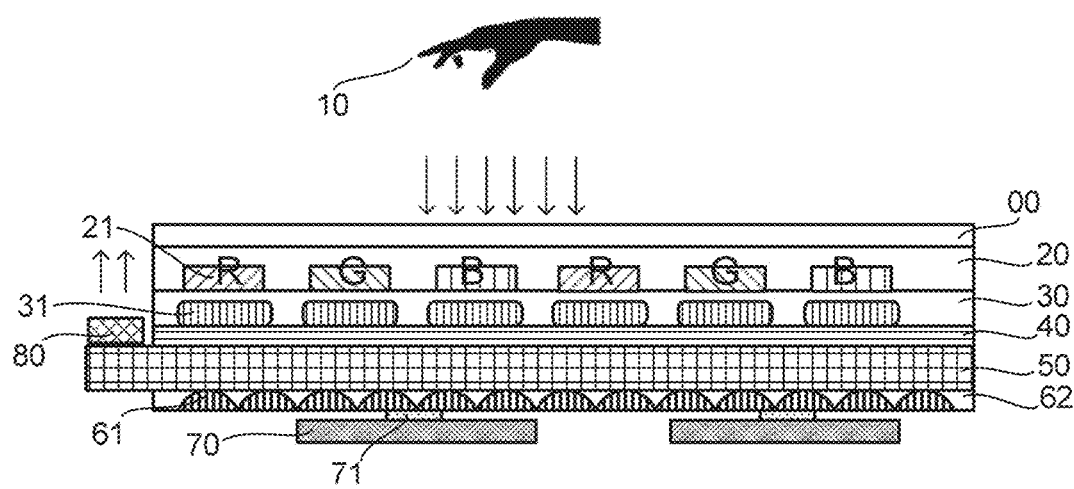
FIG. 7 is a schematic side view of the apparatus integrated a micro-lens layer and TOF light sensors in display areas of an AMOLED display panel for gesture recognition according to another embodiment of the present disclosure.

FIG. 7 is a schematic side view of the apparatus integrated a micro-lens layer and TOF light sensors in display areas of an AMOLED display panel for gesture recognition according to another embodiment of the present disclosure. Referring to FIG. 7, the apparatus integrated a micro-lens layer and TOF light sensors in display areas of an AMOLED display panel for gesture recognition is substantially the same one shown in FIG. 6. The light source 80, in this embodiment, is disposed at a front side near edge region of the backplane glass substrate 50, which is made slightly bigger than the color-filter glass substrate 20. The light source 80 is then configured to emit an infrared light signal from that position substantially free from being blocked by other device elements to illuminate a target object in the field of view above the cover glass 00 (overlying the color-filter glass substrate 20) of the AMOLED display panel.

Figure 8:
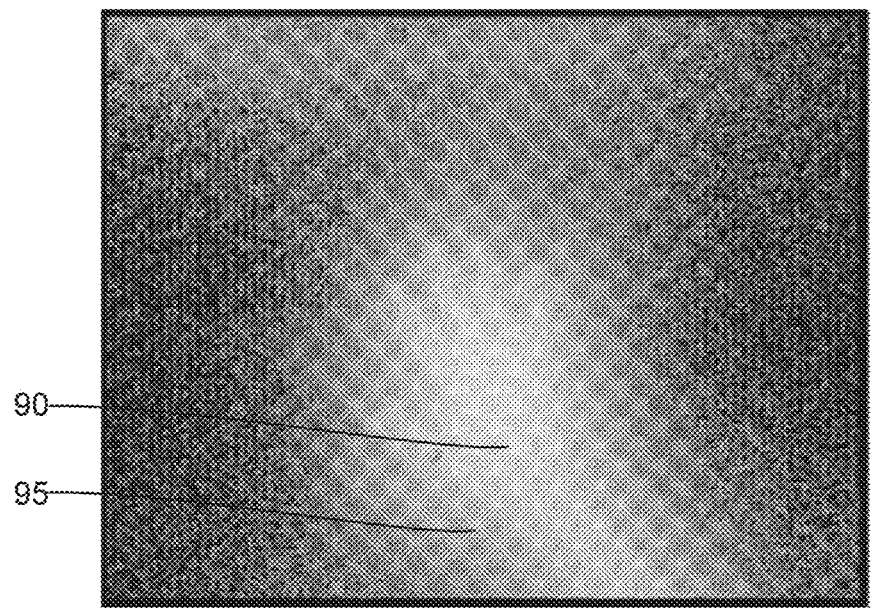
FIG. 8 is an exemplary diagram of a raw image captured by an apparatus based on infrared light passing through the OLED display panel according to an embodiment of the present disclosure.

FIG. 8 is an exemplary diagram of a raw image captured by an apparatus based on infrared light passing through the OLED display panel according to an embodiment of the present disclosure. Referring to FIG. 8, a raw image of a hand (i.e., a target object) in gray-scale is obtained by an apparatus described earlier in FIG. 6 or FIG. 7 disposed at the back side of the OLED display panel. Although the outline of the hand 90 is relatively clear, there is still some fussy shadowing background 95 around the hand 90. In an embodiment, the controller used to collect all raw data that converted from the light signals detected by every light sensor integrated with the OLED display panel is also configured to process these raw data to deduce depth information based on time-of-fly (TOF) information associated with specific region of the target object carried in each raw data. If the shadowing background is brute force included in the depth calculation, the final 3D spatial image of the object would have relatively poor quality. In the embodiment, the controller includes a preset algorithm configured to remove shadowing portions in the raw data directly converted from the infrared light signals detected by the multiple light sensors. Then, the controller performs depth calculation using updated data with the shadowing background being removed to obtain final 3D spatial image of the object. Of course, many variations, alternatives, modifications of using image processing to treat the raw data obtained from TOF light sensors can be implemented.

In some embodiments, a preset algorithm for removing shadowing portions in the raw data directly converted from the infrared light signals detected by the multiple light sensors is provided. In some embodiments, the algorithm includes inputting an image, denoising the image by filtering the image using a filter; calculating a probability that a pixel is a pixel of a hand image using random forest classification model, performing a morphological operation; performing a probability map threshold segmentation operation; performing a block segmentation; determining a largest block segment subsequent to performing the block segmentation; extracting an original depth image from the image using the largest block segment as a mask; and outputting a gesture based on a result of the extracting step.

In another aspect, the present disclosure provides an apparatus having multiple small array light sensors aligned with independently controllable micro lens discretely integrated in display area across entire display panel for multi-angle 3D spatial positioning. The multi-angle 3D spatial positioning provides a solution of capturing full 3D spatial information of a target partially blocked by unwanted object. Unlike traditional 3D depth camera using large array single chip light sensor disposed at a special allocated position in front side of the display panel, the display area of the display panel in current disclosure does not have to be sacrificed. Integration of these small array light sensors to the display panel can be implemented with much lower cost by using surface-mounting or micro transfer-printing process to attach multiple pre-fabricated small array (or even single-pixel) light sensors onto the display panel. Additionally, controllable micro lens can be achieved by forming a liquid crystal layer including a plurality of lens electrodes coupled electrically to a controller circuit which provides voltage or current signals to individually control each of the plurality of lens electrodes to effectively turn nearby portions liquid crystal layer into an effective lens with various angle and focal length.

Figure 9:
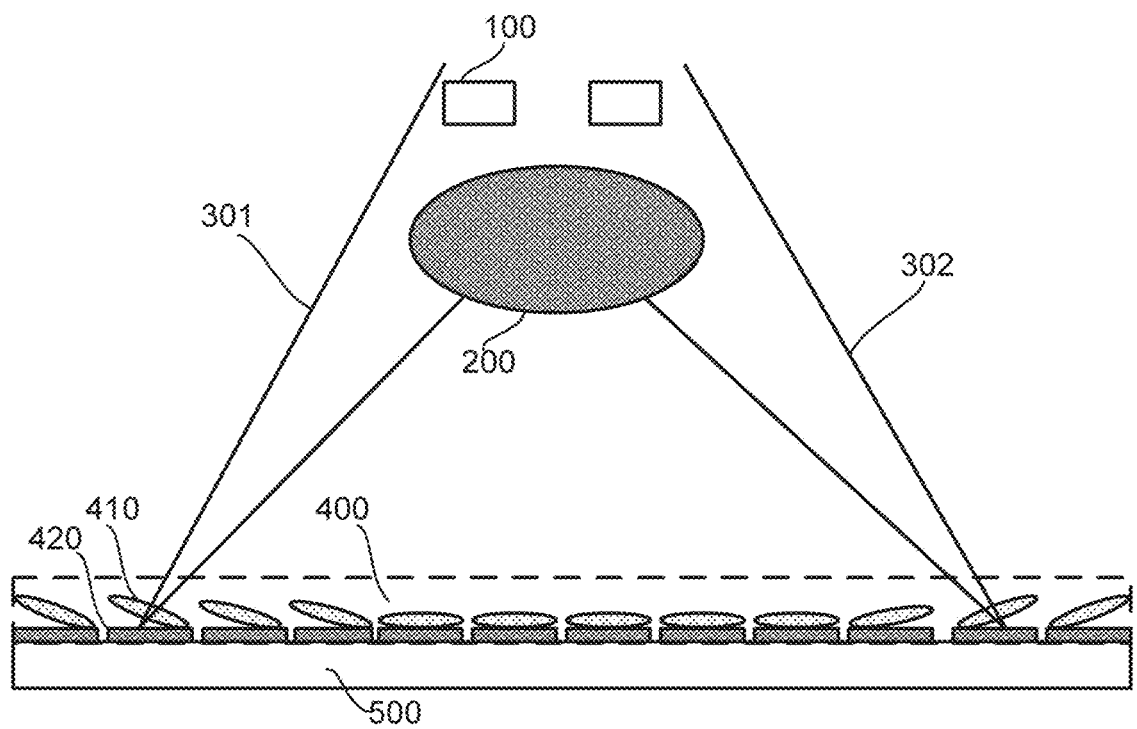
FIG. 9 is a schematic diagram showing a principle of target-blocking prevention through multi-angle spatial positioning according to an embodiment of the present disclosure.

FIG. 9 is a schematic diagram showing a principle of target-blocking prevention through multi-angle spatial positioning according to an embodiment of the present disclosure. Referring to FIG. 9, a layer 400 including a plurality of micro-lens 410 controlled by a plurality of lens electrodes 420 is integrated with a display panel 500. Optionally, the layer 400 includes a liquid crystal layer. Optionally, the layer 400 includes a common electrode (not shown) formed on top and the plurality of lens electrodes 420 discretely distributed at bottom of the layer 400. Each lens electrode 420 is controlled by either a voltage signal or a current signal provided by a controller and is independently adjusted to provide variations in electromagnetic field around local liquid crystal molecules. The electromagnetic field drives the liquid crystal molecules to change their physical characteristic orientation or density in terms of shifting, rotating, or twisting motions collectively and locally depending on designs of the lens electrodes and electromagnetic nature of the liquid crystal molecules. The change of the liquid crystal molecules orientation and density effectively changes optical properties of the local region of the layer 400, forming an effective lens that can be used to manipulate a light beam passing through thereof.

Referring to FIG. 9, the display panel integrated with a plurality of effective independently controllable micro-lens is used to provide multi-angled 3D spatial positioning of a target object 100 partially blocked by an unwanted object 200. Optionally, this display panel includes a backplane substrate having multiple light sensors disposed discretely to its back side under the display area thereof, as described earlier in FIGS. 2-7. Optionally, this display panel also includes one or more light sources configured to provide infrared light signals with major propagation directions from the backplane substrate towards top cover of the display panel. In case the unwanted object 200 is in front of the target object 100, a nominal path of the infrared light signal emitted from the light source for illuminating the object 100

(target) may be blocked, if the light source is disposed directly below. In the embodiment, provided at least one of the one or more light sources (not shown) is disposed near an edge region of the backplane substrate, one or more effective micro lenses 410 near the edge region (left one as shown) can be independently adjusted to redirect the infrared light signals 301 emitted from an individual light source to illuminate the target object 100 along one or more paths in different angles that may not be blocked or even partially blocked by the unwanted object 200. Accordingly, one or more other effective micro lenses 410 at some other corresponding regions of the layer 400 may be independently adjusted to allow some reflected infrared light signals to be deflected to some light sensors (not shown) disposed near the other corresponding regions. By collecting these reflected light signals with just a portion of the multiple light sensors disposed to the display panel, a 3D spatial information of the target object can be at least partially deduced even in the condition that the target object is blocked by an unwanted object in nominal detection directions.

Figure 10:
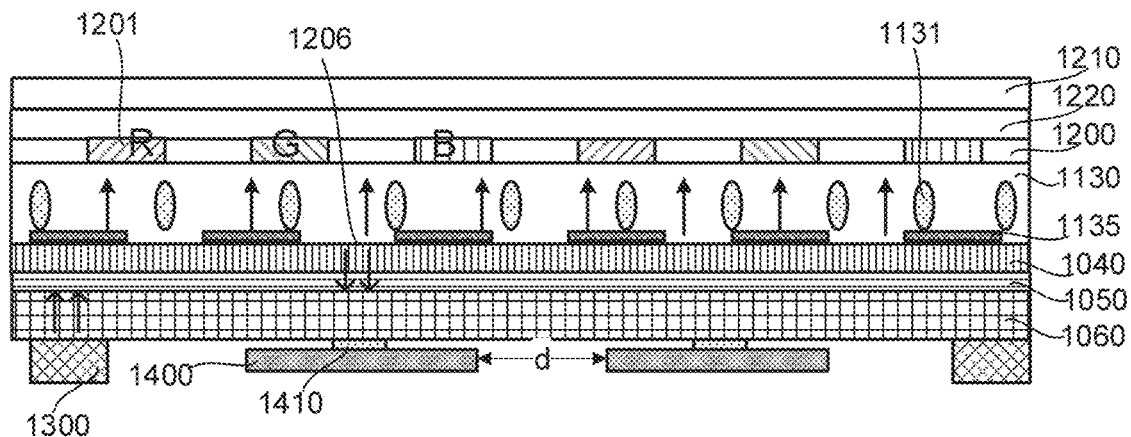
FIG. 10 is a schematic side view of the apparatus integrated a liquid crystal lens layer and TOF light sensors in display area of an AMOLED display panel for multi-angle spatial positioning according to an embodiment of the present disclosure.

FIG. 10 is a schematic side view of the apparatus integrated a liquid crystal lens layer and TOF light sensors in display area of an AMOLED display panel for multi-angle spatial positioning according to an embodiment of the present disclosure. Referring to FIG. 10, the apparatus includes a backplane glass substrate 1060 which is part of the AMOLED display panel. Further, the apparatus includes a thin-film transistor layer 1050 overlying a front side of the backplane glass substrate 1060. Additionally, the apparatus includes an organic light-emitting diode layer 1040 overlying the thin-film transistor layer 1050, forming an array substrate unit of the AMOLED display panel. The organic light-emitting diode layer includes a plurality of active subpixels arranged in a display area which is configured with multiple gaps 1206 between at least some active subpixels, respectively. In the embodiment, detail features of the active subpixels are not determining factors to limit functionalities of the apparatus, except that the gaps 1206 between the active subpixels are arranged to leave some optical paths through the display area associated with the organic light-emitting diode layer 1040. The size of the gap 1206 is just depended upon the subpixel size and pixel unit area as well as any black area for pixel circuits and signal lines. In an example, the locations of the gaps 1206 are prearranged across the area of entire backplane glass substrate 1060 of the AMOLED display panel. Optionally, the locations of the gaps 1206 are substantially uniformly distributed across the display panel. Optionally, the gaps 1206 are arranged in the display area with certain patterns. Optionally, the location arrangement of the gaps 1206 across the display panel is irregular.

In the embodiment, the apparatus further includes a color-filter glass substrate 1220 with a color filter layer 1200 overlying a back side thereof, which is part of a counter substrate unit of the AMOLED display panel. The color filter layer 1200 is featured with an array of colored films 1201 in red (R), green (G), and blue (B) colors for providing full colored display. On top of the color-filter glass substrate 1220 there is a cover glass 1210.

In the embodiment, the apparatus includes a liquid crystal layer 1130 including a plurality of lens electrodes 1135. The liquid crystal layer 1130 is formed between the organic light-emitting diode layer 1040 and the color filter layer 1200 as the array substrate unit is engaged with the counter substrate unit to form the AMOLED display panel. The liquid crystal layer 1130 is made of plurality of liquid crystal molecules 1131 which are normally set in a state substantially transparent for primary light emission from the organic light-emitting diode without affecting normal display function of the AMOLED display panel. Yet, the liquid crystal layer 1130 is added, at specific conditions for 3D spatial sensing, to form a plurality of independently controllable micro lenses to guide a plurality of infrared light signals for multi-angled sensing of 3D spatial information of a target object, respectively. The plurality of lens electrodes 1135 and associated driving circuits are all buried in the liquid crystal layer 1130. Optionally, the driving circuits are coupled by a controller configured to provide independent voltage or current signals to adjust the plurality of lens electrodes 1135, respectively. Accordingly, electrical field around nearby liquid crystal layer 1130 is changed and modified to change orientation or density of liquid crystal molecules 1131 nearby with corresponding changes in optical properties, creating an effective micro lens there for independently re-directing the infrared light signals through the display panel with multi-angle variations for the purpose of multi-angled 3D spatial positioning.

In the embodiment, the apparatus further includes at least one light source 1300 configured to the backplane glass substrate 1060 to provide infrared light signals along directions substantially from the backplane glass substrate 1060 toward a field of view beyond (the cover glass 1210) the color-filter glass substrate 1220. Optionally, the light source 1300 is disposed near an edge region on the back side of the backplane glass substrate 1060, where the infrared light is less likely to be blocked by other transistor devices or pixel elements above. Optionally, the light source 1300 is disposed in a middle region on the back side of the backplane glass substrate 1060, provided that the location of the light source 1300 is also at least partially aligned with one or more gaps left between the active subpixels in the organic light-emitting diode layer 1040 so that the infrared light signal emitted from the light source 1300 can pass through the AMOLED display panel once and reach a target object in the field of view above the cover glass 1210. Optionally, the light source 1300 is disposed at front side of the backplane glass substrate 1060 in its peripheral region. The backplane glass substrate 1060 can be made slightly bigger than the counter substrate so that the infrared light signal emitted from the light source 1300 is substantially free from being blocked. Optionally, multiple light sources 1300 are disposed at various locations associated with the backplane glass substrate 1060.

In the embodiment, furthermore, the apparatus includes multiple light sensors 1410 discretely attached to a back side of the backplane glass substrate 1060 at least partially aligned with some of the multiple gaps 1206 in the display area. As the apparatus is in process to detect 3D spatial information of the target disposed in the field of view, the plurality of lens electrodes 1135 in the liquid crystal layer 1130 are independently adjusted to allow multi-angled illumination of a target in the field of view via the infrared light signals from the at least one light source 1300 and multi-angled reflection of the infrared light signals detected by the multiple light sensors 1410 for achieving 3D spatial positioning of the target. In particular, each light sensor 1410 is substantially the same as the light sensor 71 of FIG. 2. Each light sensor 1410 is associated with a control circuit 1400 similar to the light-sensing chip 70 of FIG. 2. Optionally, the multiple light sensors 1410 are disposed with an average separation d away from each other on the backside of the backplane glass substrate 1060. The alignment between a location of the gap 1206 left in the display area and a location for disposing an individual light sensor 1410 helps reduce power loss of the reflected infrared light signal detected by the light sensor and enhances signal-to-noise ratio in sensing the 3D spatial information of the target. Optionally, each light sensor 1410 is made with a small array up to a few tens of light-sensing pixels configured to detect a target located in a relatively large depth range of the field of view. Optionally, each light sensor 1410 is made with a single pixel device configured to detect a target at a closer location. Optionally, the AMOLED display panel is integrated with a larger number of light sensors discretely disposed across the display panel to form an integrated 3D depth camera if each light sensor is a single-pixel light sensor. Optionally, the AMOLED display panel is integrated with a smaller number of light sensors discretely disposed across the display panel to form an integrated 3D depth camera if each light sensor has a small array (up to tens of) pixels.

Figure 11:
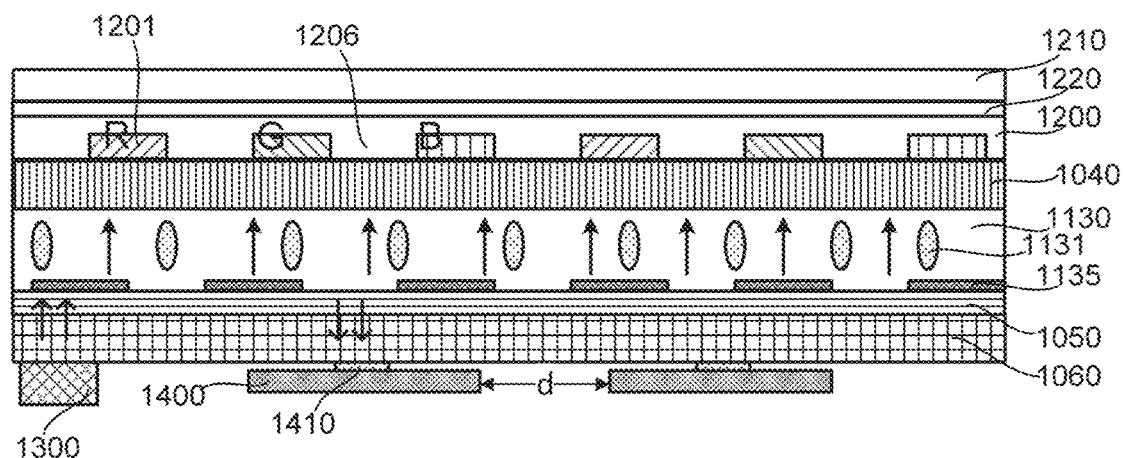
FIG. 11 is a schematic side view of the apparatus integrated a liquid crystal lens layer and TOF light sensors in display area of an AMOLED display panel for multi-angle spatial positioning according to an alternative embodiment of the present disclosure.

FIG. 11 is a schematic side view of the apparatus integrated a liquid crystal lens layer and TOF light sensors in display area of an AMOLED display panel for multi-angle spatial positioning according to an alternative embodiment of the present disclosure. In some embodiments, the liquid crystal layer 1130 can be added to in-cell structure of the AMOLED display panel unlike the case of FIG. 10 where the liquid crystal layer 1130 is added on-cell of the AMOLED display panel.

Referring to FIG. 11, the apparatus includes a backplane glass substrate 1060 and a thin-film transistor layer 1050 overlying a front side of the backplane glass substrate 1060. The apparatus further includes a liquid crystal layer 1130 overlying the thin-film transistor layer 1050. The liquid crystal layer includes a plurality of lens electrodes 1135 embedded in a plurality of liquid crystal molecules 1131. Additionally, the apparatus includes an organic light-emitting diode layer 1040 overlying the liquid crystal layer 1130. The organic light-emitting diode layer 1040 includes a plurality of active subpixels arranged in a display area configured with multiple gaps 1206 between at least some active subpixels. Each active subpixel being configured by an organic light-emitting diode to emit light for display. Furthermore, the apparatus includes a color-filter glass substrate 1220 having a color filter layer 1200 overlying a back side thereof. The color filter layer 1200 is attached to the organic light-emitting diode layer 1040 as the backplane glass substrate 1060 and associated structure is engaged with the color-filter glass substrate 1220 and associated structures to form a display panel. The apparatus further includes at least one light source 1300 associated with the backplane glass substrate 1060 and configured to provide infrared light signals along directions substantially from the backplane glass substrate 1060 toward a field of view beyond a cover glass 1210 overlying the color-filter glass substrate 1220. Moreover, the apparatus includes multiple light sensors 1410 discretely attached to a back side of the backplane glass substrate 1060 at least partially aligned with some of the multiple gaps 1206 in the display area. In the embodiment, the plurality of lens electrodes 1135 in the liquid crystal layer 1130 are independently adjusted to allow multi-angled illumination of a target in the field of view via the infrared light signals from the at least one light source 1300 and multi-angled reflection of the infrared light signals detected by the multiple light sensors 1410 for achieving 3D spatial positioning of the target. In the embodiment, each light sensor 1410 is integrated with a control circuit 1400 configured to generate a single patch of image about partial 3D spatial information of a region of the target. All the control circuits 1400 of the multiple light sensors 1410 disposed to the AMOLED display panel are coupled together to allow a complete image to be assembled for 3D spatial positioning of the target. In the embodiment, the liquid crystal layer provides a plurality of micro lens for guiding both emitting infrared light signal to illuminate the target with multi-angle options and reflected infrared light signal to be detected in multi-angled directions to enhance 3D sensing capability. Particularly, it provides a solution for sensing 3D spatial information of a target in the field of view that is partially blocked by unwanted object.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention". "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first". "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display apparatus for detecting three-dimensional (3D) spatial information, comprising:
   a display panel comprising a plurality of active subpixels in a display area configured with multiple gaps, two adjacent gaps being spaced apart by one or more active subpixels, the display panel comprising a counter substrate at front and a backplane substrate at back;
   multiple light sensors substantially aligned with the multiple gaps in the display area, respectively;
   a light source on the backplane substrate and configured to provide an infrared light signal in a direction toward a field of view beyond the counter substrate; and
   an optical layer configured to focus infrared light signals reflected from multiple different regions of an object in the field of view illuminated by infrared light signals to the multiple light sensors, the multiple light sensors being attached discretely on a back side of the optical layer;
   wherein the multiple light sensors are configured to detect infrared light signals reflected from the multiple different regions of the object for collectively deducing 3D spatial information of the object;
wherein the optical layer comprises a plurality of micro lenses substantially aligned with the multiple gaps in the display area, respectively;
the plurality of micro lenses are between the multiple light sensors and the multiple gaps in the display area, respectively;
the plurality of micro lenses are configured to couple infrared light reflected from the object through the multiple gaps in the display area to the multiple light sensors, respectively;
the optical layer comprises a liquid crystal layer comprising a plurality of micro-lenses and a plurality of lens electrodes, each of lens electrodes controlled by a voltage and changes liquid crystal molecules to create effective lenses, each of the effective lenses is controllable to independently adjust reflecting and detecting angles;
the multiple light sensors comprise multiple pre-fabricated integrated circuit chips attached to the back side of the optical layer, respectively;
the multiple pre-fabricated integrated circuit chips are disposed to multiple discrete locations behind the display area of the display panel substantially aligned with the multiple gaps in the display area, respectively; and
the multiple pre-fabricated integrated circuit chips are electrically coupled to a controller for assembling patches of images associated with depth information of regions to calculate a complete 3D spatial image of the object, respectively.

2. The display apparatus of claim 1, wherein an individual light sensor of the multiple light sensors comprises one or more light-sensing pixels configured to convert light signals to electrical signals to deduce one or more pieces of time-of-fly (TOF) information based on one or more infrared light signals reflected from one or more regions of the object disposed within a range of the field of view.

3. The display apparatus of claim 2, wherein the individual light sensor comprises a single light-sensing pixel and is configured to detect infrared light signal reflected from a distinct region of the object within a first range of the field of view, the distinct region being non-overlapped with other regions corresponding to other light sensors having a single light-sensing pixel, the individual light sensor being configured to process the one piece of TOF information to generate an image of a single pixel associated with a depth information of the distinct region of the object.

4. The display apparatus of claim 2, wherein the individual light sensor comprises a plurality of light-sensing pixels and is configured to detect one infrared light signal reflected from a region of the object within a second range of the field of view, and also partially detect more infrared light signals reflected from some other regions that are partially overlapped with the region of the object, the individual light sensor having the plurality of light-sensing pixels being configured to generate an image of one or more of pixels associated with depth information of the region of the object.

5. The display apparatus of claim 1, wherein the multiple pre-fabricated integrated circuit chips are disposed to multiple substantially uniformly distributed discrete locations behind the display area of the display panel, respectively.

6. The display apparatus of claim 1, wherein the controller comprises a preset algorithm configured to remove shadowing portions in gray-scale data directly converted from the infrared light signals detected by the multiple light sensors before performing depth calculation to deduce the 3D spatial image of the object.

7. The display apparatus of claim 1, wherein the multiple gaps in the display area provide an optical path for the infrared light signal emitted from the light source to illuminate the object in the field of view and optical paths for allowing infrared light signals partially reflected from the object to reach the optical layer.

8. The display apparatus of claim 1, wherein the light source comprises an infrared light-emitting diode or a vertical-cavity surface-emitting laser diode, configured to emit an infrared light with a wavelength of 870 nm or 940 nm that is modulated with a single frequency square wave by a modulator.

9. The display apparatus of claim 1, comprising one or more light sources disposed either at a back side of the optical layer by surface-mount or transfer-print or at a front side of the backplane substrate in a peripheral region of the display area, wherein the backplane substrate is made slightly bigger than the counter substrate.

10. The display apparatus of claim 1,
wherein first multiple lens electrodes of the plurality of lens electrodes are configured to independently receive different signals; and
the multiple light sensors are configured to detect multi-angled reflection of the infrared light signals through first multiple gaps and first multiple micro lens corresponding to the first multiple lens electrodes.

11. The display apparatus of claim 10, wherein an individual light sensor of the multiple light sensors comprises a single pixel or a plurality of pixels for sensing the multi-angled reflection of the infrared light signals carrying one or more pieces of time-of-fly (TOF) information associated with a portion of a target, producing a patch of image in a single pixel or a plurality of pixels.

12. The display apparatus of claim 10, wherein the multiple light sensors further comprise integrated circuits coupled to each other and configured to assemble all patches of images for 3D spatial positioning of a target, respectively.

13. The display apparatus of claim 10, wherein the plurality of lens electrodes are configured to independently receive different signals at different time to turn nearby portions of the liquid crystal layer to effective lenses with different angles and focal lengths, respectively.

14. The display apparatus of claim 1,
wherein second multiple lens electrodes of the plurality of lens electrodes are configured to independently receive different signals; and
the light source is configured to apply multi-angled illumination of a target through second multiple gaps and second multiple micro lens corresponding to the second multiple lens electrodes.

15. The display apparatus of claim 14, wherein some of the effective lenses are controlled to guide the infrared light signals emitted from at least one light source to illuminate the target disposed in a depth range of the field of view from multiple different angles.

16. The display apparatus of claim 14, wherein some of the effective lenses are controlled to guide the infrared light signals partially reflected from the target disposed in a depth range of the field of view to multiple angled directions to be detected by some of the multiple light sensors.

17. The display apparatus of claim 1, wherein the light source comprises an infrared light-emitting diode or a vertical-cavity surface-emitting laser diode, configured to emit an infrared light beam that is modulated with a single frequency square wave by a modulator.

18. The display apparatus of claim 1, wherein the light source is disposed via surface-mount or transfer-print to a back side of the backplane substrate at least partially aligned with some of the multiple gaps in the display area, wherein the backplane substrate is made to be slightly larger than the counter substrate.

19. The display apparatus of claim 1, wherein the light source is disposed via surface-mount or transfer-print to a front side of the backplane substrate in a peripheral region of the display area, wherein the backplane substrate is made to be slightly larger than the counter substrate.

* * * * *